United States Patent
Chen et al.

(10) Patent No.: US 11,069,559 B1
(45) Date of Patent: Jul. 20, 2021

(54) SEMICONDUCTOR STRUCTURE AND METHOD OF FORMING SAME

(71) Applicant: Nexchip Semiconductor Corporation, Anhui (CN)

(72) Inventors: Sun-Hung Chen, Anhui (CN); Tsun-Min Cheng, Anhui (CN); Jui-Min Lee, Anhui (CN); Wei Xiang, Anhui (CN); Renwei Zhu, Anhui (CN)

(73) Assignee: NEXCHIP SEMICONDUCTOR CORPORATION, Hefei (CN)

( * ) Notice: Subject to any disclaimer, the term of this patent is extended or adjusted under 35 U.S.C. 154(b) by 0 days.

(21) Appl. No.: 16/908,257

(22) Filed: Jun. 22, 2020

(30) Foreign Application Priority Data

May 20, 2020 (CN) .......................... 202010430509.5

(51) Int. Cl.
*H01L 21/762* (2006.01)
*H01L 29/06* (2006.01)
*H01L 21/3105* (2006.01)

(52) U.S. Cl.
CPC .. *H01L 21/76229* (2013.01); *H01L 21/31053* (2013.01); *H01L 29/0649* (2013.01); *H01L 21/76224* (2013.01); *H01L 21/76264* (2013.01)

(58) Field of Classification Search
CPC ......... H01L 21/76229; H01L 21/31053; H01L 29/0649; H01L 21/76224; H01L 21/76264; H01L 21/763; H01L 21/84
USPC ........ 257/506, 510; 438/207, 218, 219, 294, 438/427
See application file for complete search history.

(56) References Cited

U.S. PATENT DOCUMENTS

| 6,372,605 B1 | 4/2002 | Kuehne |
| 2014/0094017 A1* | 4/2014 | Sie et al. .......... H01L 21/76232 438/424 |

\* cited by examiner

*Primary Examiner* — Thinh T Nguyen
(74) *Attorney, Agent, or Firm* — Muncy, Geissler, Olds & Lowe, P.C.

(57) ABSTRACT

A semiconductor structure and method for forming such a structure are disclosed by the present invention. In the method, before a first trench in a pre-processed substrate is filled with any filling material, an auxiliary layer is formed over an inner surface of the first trench. Afterward, a first filling dielectric is formed and an etch back process is performed so that a top surface of the first filling dielectric is higher than that of the pre-processed substrate, and a second filling dielectric is then formed and subject to a second planarization process.

8 Claims, 5 Drawing Sheets

SEMICONDUCTOR STRUCTURE AND METHOD OF FORMING SAME

CROSS-REFERENCE TO RELATED APPLICATION

This application claims the priority of Chinese patent application number 202010430509.5, filed on May 20, 2020, the entire contents of which are incorporated herein by reference.

TECHNICAL FIELD

The present invention relates to the field of semiconductor technology and, in particular, to a semiconductor structure and a method for forming such a structure.

BACKGROUND

In the manufacture of integrated circuits, various individual components formed on a substrate, such as different memory cells and different transistors, are usually isolated from one another with shallow trench isolation (STI) structures. The fabrication of such STI structures typically involves: forming a pad oxide layer and a silicon nitride layer over the substrate; forming isolation trenches at designated regions through sequentially etching the silicon nitride layer, pad oxide layer and substrate; and depositing an isolating dielectric over the substrate and performing thereon a chemical mechanical polishing (CMP) process so that a top surface of the isolating dielectric filled in the isolation trenches becomes substantially flush with a top surface of the silicon nitride layer.

In this process, in order to fill up the isolation trenches while ensuring an adequate process margin for the subsequent CMP process, the isolating dielectric deposited on the substrate has to be rather thick and typically has an irregular surface. Relatively speaking, over the substrate, the isolating dielectric deposited above the silicon nitride layer (serving as a polish stop material) is thicker at narrow isolation trenches formed around densely distributed silicon nitride than at wide isolation trenches around sparsely distributed silicon nitride (or with surrounding silicon nitride having been totally removed). For this reason, the CMP process must last for a long time in order to make the isolating dielectric filled in the isolation trenches overall substantially flush with the silicon nitride layer, while the resulting surface flatness of the STI structures is typically poor. In particular, significant dishing tends to occur over those wide isolation trenches around sparsely distributed silicon nitride. The flatness of the STI structures may have an impact on the performance of components subsequently formed on the substrate.

U.S. Pat. No. 6,372,605 B1 discloses a method for fabricating an STI structure, in which before a CMP process is carried out, thicker isolating dielectric portions are exposed by patterned photoresist and thinned using a dry etching process, in order to allow a shortened CMP time. However, this method additionally requires the fabrication of a patterned mask by an exposure process, leading to increased complexity and manufacturing cost. Another method for avoiding a CMP process from resulting in dishing in isolating dielectric around sparsely distributed silicon nitride is to add polish stop structures to wide isolation trenches to create multiple dense narrow trenches (dummy trenches). However, this method also requires the fabrication of an additional mask and thus raises the manufacturing cost.

The above-described problems also occur in CMP processes for making other semiconductor structures than STI. For example, in a method of forming separated polysilicon cells in a substrate, isolation structures protruding beyond a surface of the substrate are first formed, and an oxide layer and polysilicon are then sequentially deposited over the substrate between the isolation structures, followed by a CMP process for removing the polysilicon deposited above top surfaces of the isolation structures. However, dishing often occurs on the CMP-processed polysilicon surface, leading to unsatisfactory flatness. Therefore, the conventional solutions are not satisfying in terms of efficiency and economy.

SUMMARY OF THE INVENTION

The present invention provides a method for forming a semiconductor structure to improve surface flatness during the filling of a trench, without using any complicated photolithography process. The present invention also provides a semiconductor structure formed using this method.

In one aspect, the present invention provides a method for forming a semiconductor structure, comprising the steps of:

providing a pre-processed substrate with a first trench;

forming an auxiliary layer over the pre-processed substrate, wherein the auxiliary layer covers an inner surface of the first trench and a top surface of the pre-processed substrate;

forming a first filling dielectric over the pre-processed substrate, wherein the first filling dielectric covers the auxiliary layer and completely fills the first trench;

performing a first planarization process to remove a portion of the first filling dielectric until the auxiliary layer is exposed, wherein a remaining portion of the first filling dielectric is located in the first trench and surrounded by the auxiliary layer;

etching back the auxiliary layer so that a top surface of the auxiliary layer is lower than a top surface of the first filling dielectric;

forming a second filling dielectric over the pre-processed substrate, which covers the first filling dielectric, the auxiliary layer and the pre-processed substrate and has a top surface higher than the top surface of the pre-processed substrate; and performing a second planarization process until the top surface of the pre-processed substrate is exposed.

Optionally, in the step of etching back the auxiliary layer, an etching selectivity ratio of the auxiliary layer to the first filling dielectric may be greater than 5.

Optionally, each of the first and second planarization processes may be implemented as a chemical mechanical polishing process.

Optionally, the formation of the first trench may comprise the steps of:

sequentially stacking a pad oxide layer and a hard mask layer on a semiconductor substrate and patterning the hard mask layer;

forming a first isolation trench by etching the pad oxide layer and the semiconductor substrate with the patterned hard mask layer serving as a mask; and forming a surface oxide layer over an inner surface of the first isolation trench and a top surface of the semiconductor substrate.

Optionally, after the auxiliary layer is etched back, the top surface of the auxiliary layer may be lower than the top surface of the semiconductor substrate.

Optionally, the pre-processed substrate may be provided with a second trench, wherein the second trench has a width smaller than a width of the first trench, wherein the second trench is completely filled with the auxiliary layer before the first planarization process is performed.

Optionally, after etching back the auxiliary layer, a portion of the auxiliary layer may remain in the second trench, wherein after forming the second filling dielectric, the second filling dielectric covers the portion of the auxiliary layer and fills up the second trench.

Optionally, the auxiliary layer may comprise silicon nitride, wherein each of the first and second filling dielectrics comprises silicon oxide.

In another aspect, the present invention also provides a semiconductor structure. The semiconductor structure comprises:

a pre-processed substrate with a first trench;

an auxiliary layer covering a bottom surface of the first trench and a portion of a side surface that is joined to the bottom surface; and a filling dielectric covering the auxiliary layer and filling up the first trench.

Optionally, the semiconductor structure may include a shallow trench isolation (STI) structure.

With the fabrication of an STI structure as an example, based on analysis, reasons for undesirable surface flatness of the semiconductor structure resulting from a CMP process are considered as follows. When there are significant shape irregularities across the surface to be smoothed and a non-uniform distribution density of pattern features (especially those of silicon nitride serving as a polish stop material) across various locations, it is very likely to expect insufficient top surface flatness even after the polishing. Generally, when arriving at the polish stop, since there is abundant silicon nitride, a material capable of resisting corrosion of the polishing slurry and imparting to the polishing slurry a certain polishing selectivity ratio, in locations with densely distributed pattern features, the polishing process can stop well at these locations. By contrast, as silicon nitride is relatively rare in locations with fewer (or sparse) pattern features, these locations exhibit weaker resistance to polishing and thus tend to give rise to a depression lower than the surrounding surface (i.e., dishing) even at an over-polish amount that would be considered moderate regularly. Thus, for a trench at a location with sparsely distributed pattern features, if the corresponding initial surface to be polished is flush with or lower than the surrounding surface, dishing will more easily result from the polishing process, when compared to locations with dense pattern features. Further, a long CMP time will not only lower efficiency, but will also lead to a non-uniform temperature distribution across the top surface being polished and undesirable post-polishing flatness thereof.

The method proposed in the present invention offers the following advantages:

First, before the first trench is filled with the filling materials, the auxiliary layer is formed over its inner surface. Subsequently, the first filling dielectric is deposited and an etched back is performed so that its top surface is higher than that of the pre-processed substrate. In this way, in the second planarization process performed after the formation of the second filling dielectric, the portion above the first trench requires a greater amount of removal compared to the remaining. As a result, dishing will barely occur at the first trench after the second planarization process.

Second, as the first planarization process for removing the material of the first filling dielectric above the auxiliary layer is not the final determinant planarization process, it is not imposed with stringent requirements in terms of the resulting surface flatness. Additionally, compared to the approach in which a single dielectric material first fills in the first trench by a single deposition process until its top surface is higher than the substrate surface and then planarized to make its top surface flush with the substrate surface, the second filling dielectric deposited after the auxiliary layer is etched back is allowed to have a reduced thickness due to the first filling dielectric that has been filled in advance in the first trench, which allows the second planarization process to last for a shorter time than conventional CMP processes and helps in improving the resulting surface flatness of the semiconductor structure.

Third, the portion of the second filling dielectric above the first trench is made thicker than the remaining thereof prior to the second planarization process, without additional use of any separately fabricated patterned mask, making the method easier to carry out, less costly and suitable to reduce the risk of post-CMP dishing even at smaller process dimensions.

The semiconductor structure proposed in the present invention has desirable quality because it is formed by the above method that ensures good surface flatness.

Figure 1A:
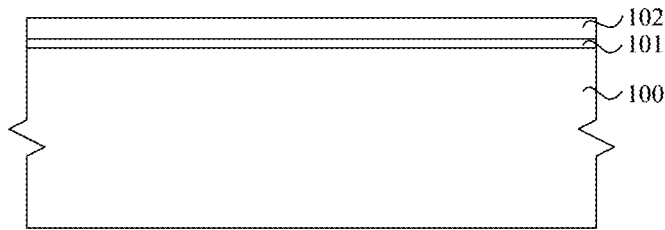
FIGS. 1A to 1D are cross-sectional views schematically illustrating a conventional method for forming an STI structure.

In these figures, 100 and 200: a semiconductor substrate; 101 and 201: a pad oxide layer; 102: a silicon nitride layer; 202: a hard mask layer; 10: an isolation trench; 103: an isolating dielectric; 11: dishing; 20: a first trench; 30: a second trench; 203: a surface oxide layer; 204: an auxiliary layer; 205: a first filling dielectric; and 206: a second filling dielectric.

DETAILED DESCRIPTION

Semiconductor structures and methods for forming them according to specific embodiments of the present invention will be described in greater detail below with reference to the accompanying drawings. Features and advantages of the invention will be more apparent from the following detailed description. Note that the figures are all provided in a very simplified form not necessarily presented to scale, with their only intention to facilitate convenience and clarity in explaining the embodiments, and these embodiments should not be considered as being limited to the specific shapes shown in the figures. For the sake of clarity, throughout the drawings for assisting in explaining the embodiments disclosed herein, like elements are in principle given like reference numerals and will not be repeatedly described hereinafter. As used in the following description, the terms "first", "second" and the like are meant to distinguish between similar elements and do not necessarily imply any particular ordinal or chronological sequence. It is to be appreciated that, where appropriate, these terms used in such a way are interchangeable.

FIGS. 1A to 1D are cross-sectional views schematically illustrating a conventional method for forming a shallow trench isolation (STI) structure. In order to promote an understanding of the principles of embodiments of the present invention, the conventional method will be described first with reference to FIGS. 1A to 1D.

FIG. 1A is a cross-sectional view after a pad oxide layer and a silicon nitride layer have been formed over a substrate by the conventional STI formation method. Referring to FIG. 1A, the method includes a first step: forming a pad oxide layer 101 and a silicon nitride layer 102 over a semiconductor substrate 100. In case of a silicon substrate, the pad oxide layer 101 is generally silica. The silicon nitride layer 102 may serve as a hard mask for an etching process.

Figure 1B:
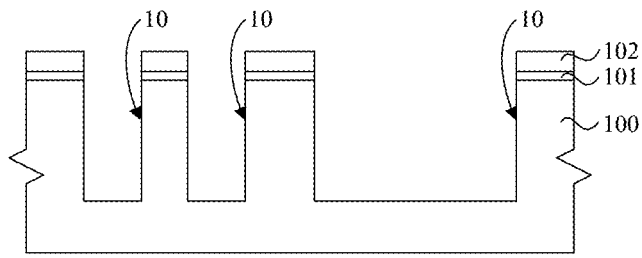

FIG. 1B is a cross-sectional view after isolation trenches have been formed by the conventional STI formation method. Referring to FIG. 1B, the method includes a second step: forming isolation trenches 10 at designated regions by sequentially etching the silicon nitride layer 102, the pad oxide layer 101 and the semiconductor substrate 100. A plurality of isolation trenches 10 of various widths may be formed in the semiconductor substrate 100 as required. In general, an oxide layer (not shown) is additionally formed over an inner surface of the formed isolation trenche 10 in order to repair the isolation trench.

Figure 1C:
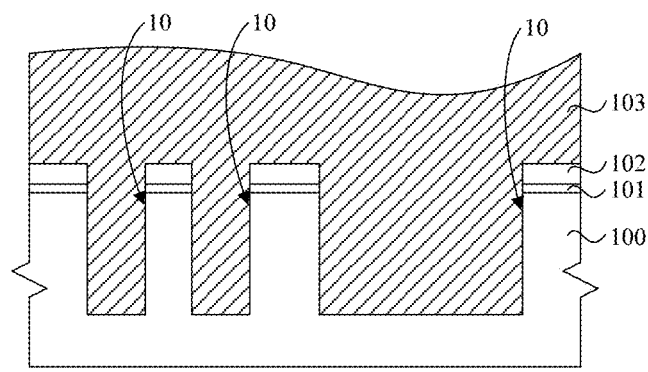

FIG. 1C is a cross-sectional view after an isolating dielectric has been deposited over the substrate by the conventional STI formation method. Referring to FIG. 1C, the method includes a third step: depositing an isolating dielectric 103 to fill the isolation trench 10 in the semiconductor substrate 100. The isolating dielectric 103 is commonly silicon oxide.

Figure 1D:
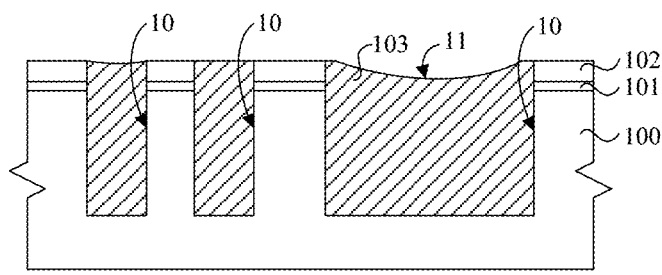

FIG. 1D is a cross-sectional view after a planarization process has been carried out by the conventional STI formation method. Referring to FIG. 1D, the method includes a fourth step: planarizing a surface of the semiconductor substrate 100 using a chemical mechanical polishing (CMP) process. In this step, with the silicon nitride layer 102 serving as a planarization stop layer, the planarization process is performed to expose the silicon nitride layer 102 on the semiconductor substrate 100. As a result, a top surface of the isolating dielectric 103 in narrow isolation trenches 10 with small widths (i.e., the dimensions parallel to surface of the semiconductor substrate 100) (e.g., the leftmost two isolation trenches 10 in FIG. 1D) is substantially flush with a top surface of the silicon nitride layer 102. Here, the phrase "substantially flush with" means that a height difference between the top surfaces of the isolating dielectric 103 and the silicon nitride layer 102 is controlled within a tolerable range for the planarization process. For example, in one embodiment, the height difference between the polished top surfaces of the isolating dielectric 103 and the silicon nitride layer 102 may be 5% or smaller of that before they were polished. However, dishing 11 tends to occur to wide isolation trenches 10 when the CMP process lasts for a long time, due to a lower polished surface and a sparse distribution of the surrounding hard mask material.

Therefore, the planarization process in this conventional method tends to lead to dishing in the semiconductor structure surface, which is unfavorable to the flatness of the surface.

Embodiments of the present invention relate to a method for forming a semiconductor structure, which also includes a planarization process. Compared to the conventional method discussed above, the semiconductor structure (e.g., an STI structure) resulting from the planarization process in the method according to the embodiments of the present invention has a top surface with improved flatness, as described in greater detail below.

Figure 2:
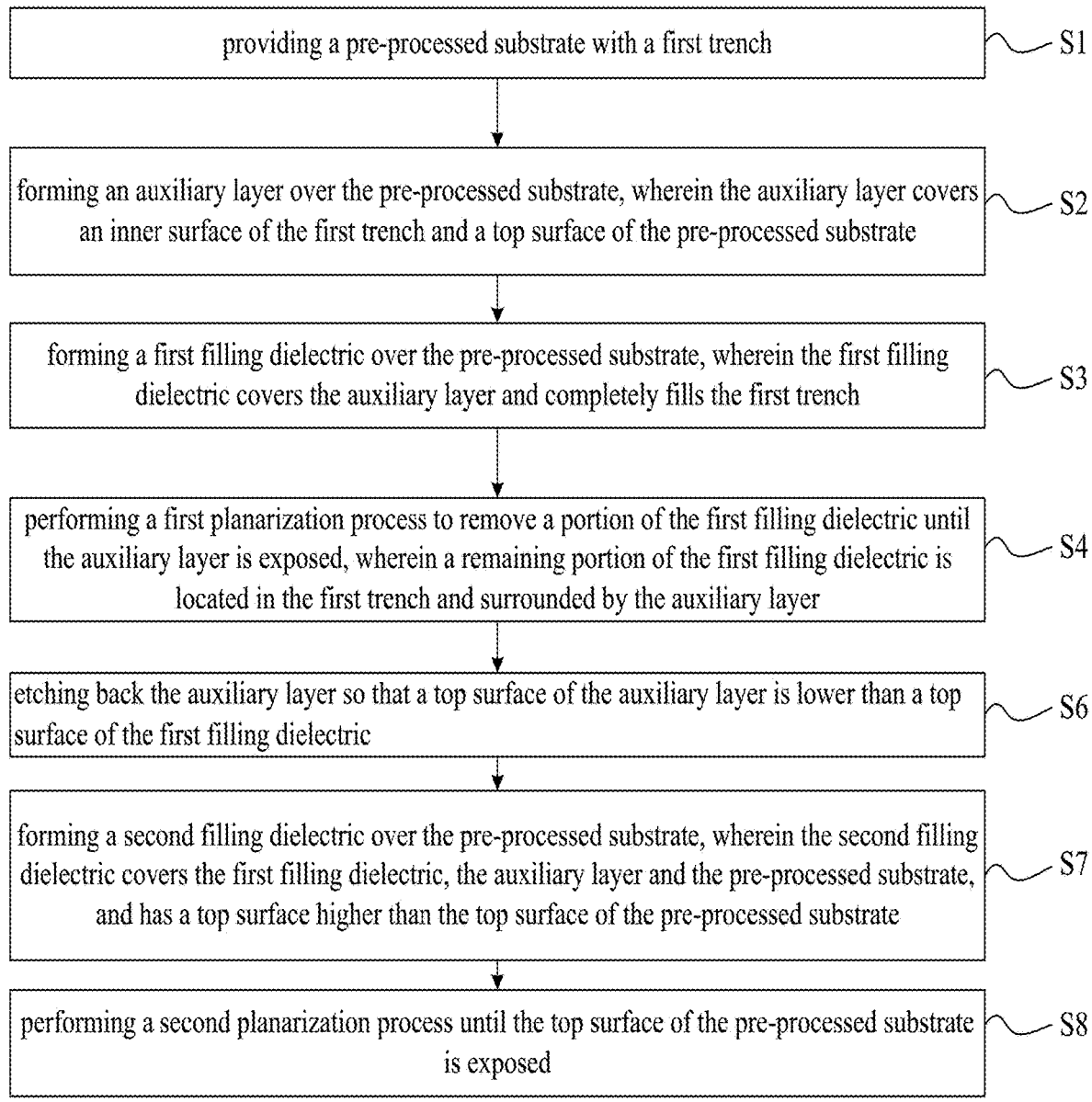
FIG. 2 is a flowchart of a method for forming a semiconductor structure according to an embodiment of the present invention.

FIG. 2 is a flowchart of a method for forming a semiconductor structure according to an embodiment of the present invention. Referring to FIG. 2, the method includes the steps of:

S1: providing a pre-processed substrate with a first trench;

S2: forming an auxiliary layer over the pre-processed substrate, wherein the auxiliary layer covers each of an inner surface of the first trench and a top surface of the pre-processed substrate;

S3: forming a first filling dielectric over the pre-processed substrate, wherein the first filling dielectric covers the auxiliary layer and completely fills the first trench;

S4: performing a first planarization process to remove a portion of the first filling dielectric until the auxiliary layer is exposed, with a remaining portion of the first filling dielectric located in the first trench and surrounded by the auxiliary layer;

S5: etching back the auxiliary layer so that a top surface of the auxiliary layer is lower than a top surface of the first filling dielectric;

S6: forming a second filling dielectric over the pre-processed substrate, wherein the second filling dielectric covers the first filling dielectric, the auxiliary layer and the pre-processed substrate and has a top surface higher than the top surface of the pre-processed substrate; and S7: performing a second planarization process until the top surface of the pre-processed substrate is exposed.

FIGS. 3A to 3G are schematic cross-sectional views of structures resulting from respective steps in a method for forming a semiconductor structure according to an embodiment of the present invention. This method will be described in greater detail below with reference to FIGS. 2 and 3A to 3G, with the semiconductor structure being a shallow trench isolation (STI) structure as an example. It is to be noted that, based on the principles of embodiments of the present invention, the method shown in FIG. 2 is not limited to the fabrication of an STI structure but may also be used in the fabrication of other semiconductor structures, which involves trench filling and planarization.

Figure 3A:
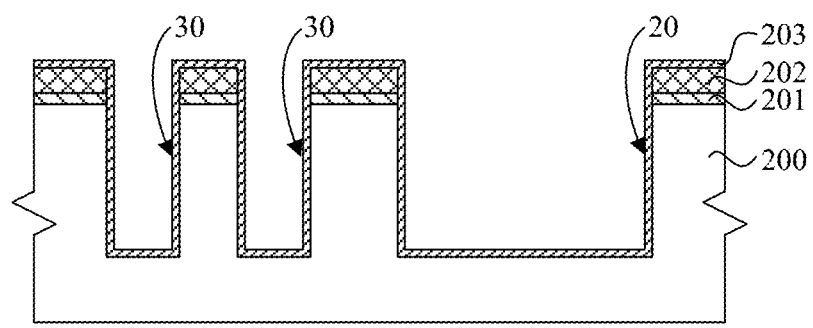
FIGS. 3A to 3G are cross-sectional views schematically illustrating a method for forming a semiconductor structure according to an embodiment of the present invention.

FIG. 3A is a cross-sectional view after a first trench has been formed using the method for forming a semiconductor structure according to an embodiment of the present invention. Referring to FIG. 3A, in step S1, providing a pre-processed substrate with a first trench 20. The pre-processed substrate is a substrate in which the first trench 20 has been formed using semiconductor processes. Depending on the component being fabricated, the first trench 20 may be formed in various positions of the pre-processed substrate and may have different shapes.

In this embodiment, the semiconductor structure may be, for example, a shallow trench isolation (STI) or deep trench isolation (DTI) structure. In this embodiment, the first trench 20 may be formed by any suitable disclosed technique. For example, in one embodiment, the formation of the first trench 20 may include the steps of: sequentially stacking a pad oxide layer 201 and a hard mask layer 202 on a semiconductor substrate 200 and patterning the hard mask layer 202; forming an isolation trench by etching the pad oxide layer 201 and the semiconductor substrate 200 with the patterned hard mask layer 202 serving as a mask; and forming a surface oxide layer 203 over an inner surface of the isolation trench so that the first trench 20 is obtained. The semiconductor substrate 200 may be formed of silicon, germanium, silicon germanium, silicon carbide, gallium arsenide, gallium phosphide, indium phosphide, indium arsenide, indium antimonide or the like, or implemented as a silicon on insulator (SOI) or germanium-on-insulator (GOI) substrate, or made of any other suitable material. The pad oxide layer 201 may be, for example, silica, and the hard mask layer 202 may be, for example, silicon nitride.

During the formation of the first trench 20, the hard mask layer 202 may be patterned using a photolithography process utilizing photoresist. The deposition of the surface oxide layer 203 may be accomplished by a furnace process, a rapid thermal oxidation process, an in-situ steam generation (ISSG) process or a dip-pen nanolithography (DPN) process. In this embodiment, the surface oxide layer 203 may be formed, for example, by an ISSG process in which oxygen and hydrogen mixed at a predefined ratio are introduced into a process chamber and react (in situ) with each other in the vicinity of a surface of the pre-processed substrate, resulting in the formation of the surface oxide layer 203. Alternatively, the surface oxide layer 203 may also cover a top surface of the hard mask layer 202.

As required by the process design, different numbers of such first trenches 20 with various widths may be formed at different positions. As shown in FIG. 3A, in this embodiment, a second trench 30 may be also formed in the surface of the pre-processed substrate, in addition to the first trench 20. The second trench 30 may be narrower than the first trench 20. Due to a greater width of the first trench 20, a relatively sparse distribution of the hard mask material 202 is present around it. That is, the first trench 20 corresponds to a region susceptible to the occurrence of dishing when the conventional STI method is used. On the contrary, the second trench 30 is less likely to suffer from dishing due to a relatively dense distribution of the hard mask material 202. In the following description of the subsequent steps, emphasis is given to the first trench 20 where dishing is easier to occur. It is to be understood that the first and second trenches 20, 30 are shown and described merely for the purpose of illustration, and in other embodiments, the second trench 20 may also correspond to a region that should be taken into account for improving surface flatness of the semiconductor structure due to possible significant dishing occurring there. In this case, the second trench 30 may also be subsequently treated in the same way as the first trench 20.

Figure 3B:
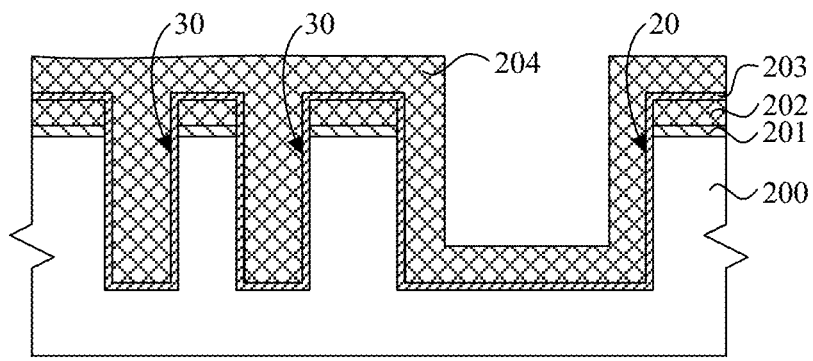

FIG. 3B is a cross-sectional view after an auxiliary layer has been formed using the method for forming a semiconductor structure according to an embodiment of the present invention. Referring to FIG. 3B, in this embodiment, in step S2, forming an auxiliary layer 204 over the pre-processed substrate so as to cover each of the inner surface of the first trench 20 and a top surface of the pre-processed substrate. The auxiliary layer may be formed using a chemical vapor deposition (CVD) or an atomic layer deposition (ALD) technique.

The auxiliary layer 204 raises top edge of the first trench 20, and since the auxiliary layer 204 covers a bottom surface of the first trench 20, it also raises the bottom of a filling material to be subsequently formed in the first trench 20. In other words, the portion of the auxiliary layer 204 deposited within the first trench 20 may be regarded as a portion of said material that is filled in advance at the bottom of the first trench 20. In this embodiment, in order to facilitate a subsequent selective etch-back process, the auxiliary layer 204 is preferably a material that is different from a predominant material of the filling material. Specifically, for etching process of the auxiliary layer 204, the process preferably possesses a high etching selectivity ratio of the auxiliary layer 204 to the predominant material. With the predominant material being implemented as silica as an example, the auxiliary layer 204 may be, for example, silicon nitride, silicon oxynitride or the like. Alternatively, when the predominant material is silicon nitride, the auxiliary layer 204 may be, for example, silica or the like. In this embodiment, the former filling scheme is adopted, in which the auxiliary layer 204 includes silicon nitride, while each of the subsequently formed first and second filling dielectrics includes silicon oxide.

A thickness of the auxiliary layer 204 may depend on details in the trench's design. In this embodiment, the auxiliary layer 204 extends over the inner surface of, but does not fill up, the first trench 20. By contrast, since the second trench 30 is narrow, it is completely filled up by the auxiliary layer 204, and the latter also covers top surfaces of hard mask layer 202 that are densely distributed around the second trench 30. In this embodiment, each of the first and second trenches 20, 30 is provided in order to form the STI structure, and portions of the auxiliary layer 204 that survive the following processes and remain within the first and second trenches 20, 30 can also contribute to the insulation between active areas defined by the STI structures.

Figure 3C:
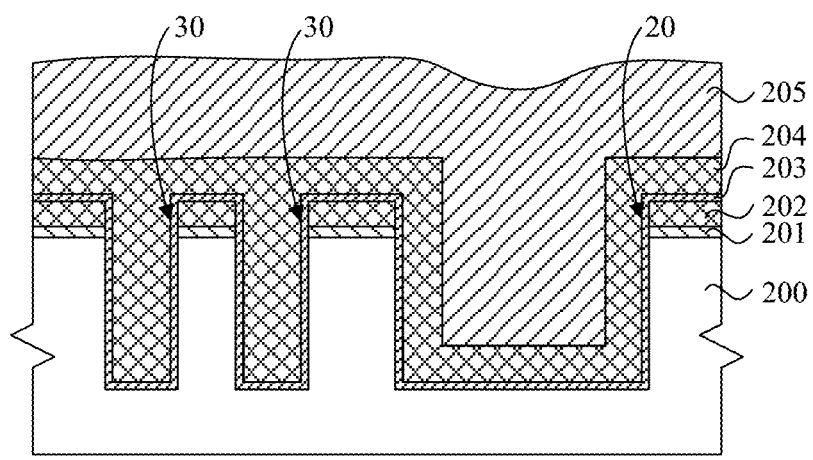

FIG. 3C is a cross-sectional view after a first filling dielectric has been formed using the method for forming a semiconductor structure according to an embodiment of the present invention. Referring to FIG. 3C, in this embodiment, in step S3, forming a first filling dielectric 205 over the pre-processed substrate, and wherein the first filling dielectric 205 covers the auxiliary layer 204 and fill up the first trench 20. The first filling dielectric 205 is provided to impart isolation properties to the STI structure and may be selected, for example, as silica. The formation of the first filling dielectric 205 may be accomplished by high density plasma deposition (HDP), high-aspect-ratio chemical vapor deposition or the like.

In this embodiment, since trenches are formed in different locations of the pre-processed substrate, a top surface of the first filling dielectric 205 formed over the entire pre-processed substrate is not flat. Relatively speaking, the first filling dielectric 205 protrudes upward higher at a portion over a dense distribution of the hard mask material, e.g., at and around any second trench 30, than a portion over a sparse distribution of the hard mask material, e.g., at and around the first trench 20. That is, there are bumps and depressions on the top surface of the first filling dielectric 205.

Figure 3D:
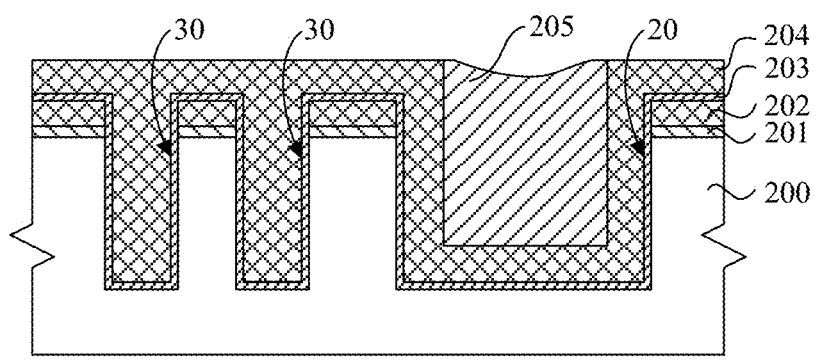

FIG. 3D is a cross-sectional view after a first planarization has been carried out using the method for forming a semiconductor structure according to an embodiment of the present invention. Referring to FIG. 3D, in this embodiment, in step S4, performing a first planarization process until the auxiliary layer 204 is exposed, with the remaining first filling dielectric 205 situated within the first trench 20 and surrounded by the auxiliary layer 204. In this embodiment, the first planarization process may be, for example, a chemical mechanical polishing (CMP) process in which the pre-processed substrate is loaded at a lower end of a polishing head, and the polishing head is then lowered to bring the first filling dielectric 205 in the pre-processed substrate downwardly into contact with a rotating polishing pad. Concurrently, a polishing slurry containing a submicron or nano abrasive and a chemical solution flows between the substrate and the polishing pad and chemical components in the polishing slurry react with the substrate surface, converting insoluble substances into soluble substances or softening hard substances. As a result, the so-treated substances can be removed from the substrate surface by micromechanical friction of the abrasive, dissolve into the running fluid and flow therewith away from the polishing pad. In this way, the substrate surface is smoothed with the combination of the chemical and mechanical forces.

In this embodiment, since the auxiliary layer 204 raises the top edge of the first trench 20, the first planarization process stops at the auxiliary layer 204. Therefore, even when dishing results from the first planarization process at the first trench 20, it will have no direct impact on the first filling dielectric 205 located within the first trench 20.

Figure 3E:
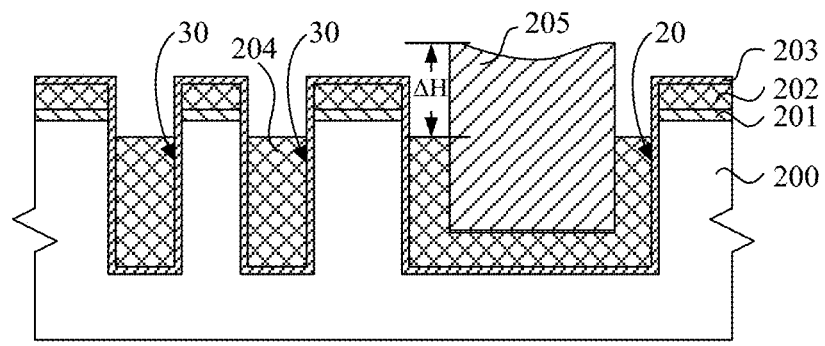

FIG. 3E is a cross-sectional view after the auxiliary layer has been etched back using the method for forming a semiconductor structure according to an embodiment of the present invention. Referring to FIG. 3E, in this embodiment, in step S5, etching back the auxiliary layer 204, making the top surface of the auxiliary layer 204 lower than the top surface of the first filling dielectric 205.

Etching back the auxiliary layer 204 is to create a height difference ΔH between the auxiliary layer 204 and the first filling dielectric 205 surrounded by the auxiliary layer. This allows a corresponding portion of the subsequently formed second filling dielectric above the first trench 20 to bulge over the surrounding portions before the second filling dielectric is planarized, thereby avoiding the occurrence of dishing at the first trench 20 due to a too low top surface of the filling structure therein. To this end, an etching selectivity ratio of the auxiliary layer 204 to the first filling dielectric 205 is preferably high so that during etch-back of the auxiliary layer 204, the first filling dielectric 205 is maintained in shape. In one embodiment, the etching selectivity ratio of the auxiliary layer 204 to the first filling dielectric 205 is greater than 5. In other embodiments, the etching selectivity ratio of the auxiliary layer to the first filling dielectric may be greater than 10, or even greater than 20.

In this embodiment, the auxiliary layer 204 may be etched back using a wet etching process. For example, when the auxiliary layer 204 is silicon nitride, the auxiliary layer 204 may be etched at 160° C. using a phosphoric acid ($H_3PO_4$) solution as an etchant. The etch-back may proceed until the top surface of the auxiliary layer is lower than that of the semiconductor substrate 200. This allows the auxiliary layer 204 to be protected by the overlying second filling dielectric during the subsequent removal of the hard mask layer 202 and the pad oxide layer 201 after the semiconductor structure has been completed. In addition, the etched-back auxiliary layer 204 remaining in the first and second trenches 20, 30 of the STI structures can enhance insulation.

After step S4, since the material of the auxiliary layer 204 deposited above the hard mask layer 202 has been removed, the top surface of the first filling dielectric 205 is beyond not only the top surface of the remaining auxiliary layer 204 but also those of the hard mask layer 202 and the surface oxide layer 203 thereon. That is, the first filling dielectric 205 has been raised in height by virtue of the auxiliary layer 204.

Figure 3F:
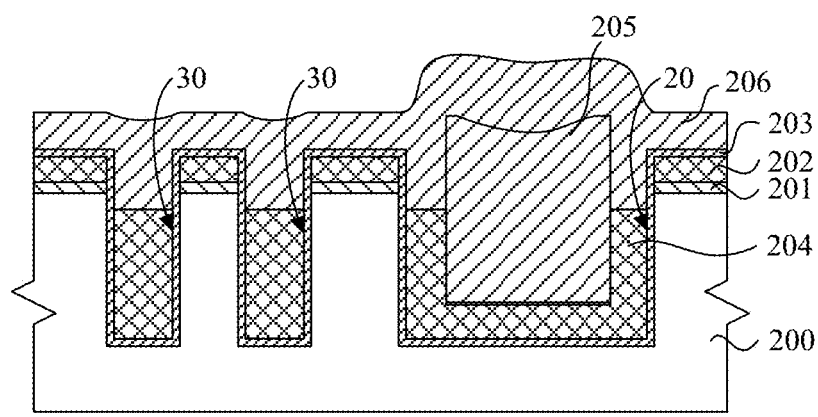

FIG. 3F is a cross-sectional view after a second filling dielectric has been formed using the method for forming a semiconductor structure according to an embodiment of the present invention. Referring to FIG. 3F, in this embodiment, in step S6, forming a second filling dielectric 206 over the pre-processed substrate, wherein the second filling dielectric covers the first filling dielectric 205, the auxiliary layer 204 and the pre-processed substrate. A top surface of the second filling dielectric 206 is higher than the top surface of the pre-processed substrate (in this embodiment, more precisely, the top surface of the surface oxide layer 203).

The second filling dielectric 206 may be formed either of the same material as the first filling dielectric 205 or of a different dielectric material. In this embodiment, the second filling dielectric 206 is also silica and may be deposited over pre-processed substrate using the same process as the first filling dielectric 205. In this embodiment, the second filling dielectric 206 fills up the space above the auxiliary layer 204 in the first and second trenches 20, 30. In addition, in order to the facilitate the subsequent planarization process, the top surface of the second filling dielectric 206 is entirely above that of the hard mask layer 202. For improved efficiency, reduced cost and a shorten cycle of the subsequent second planarization process, a thickness of the second filling dielectric 206 may be smaller than that of the first filling dielectric 205 formed in step S3, as long as it can replenish the etched-back portion of the auxiliary layer 204 while ensuring a sufficient margin above the hard mask layer 202 for the subsequent planarization process.

Due to the height difference between the first filling dielectric 205 and the surrounding auxiliary layer 204 and hard mask layer 202, after the second filling dielectric 206 is formed, a height of a portion of the second filling dielectric 206 above the first trench 20 is greater than a height of the rest thereof. Here, the height is mentioned relative to the top surface of the semiconductor substrate 200 as a reference. In other words, the distance between the top surface of the second filling dielectric 206 located above the first trench 20 and the top surface of the semiconductor substrate 200 is greater than the distance between the top surface of the second filling dielectric 206 located above the remaining regions (other than the first trench 20) and the top surface of the semiconductor substrate 200.

Figure 3G:
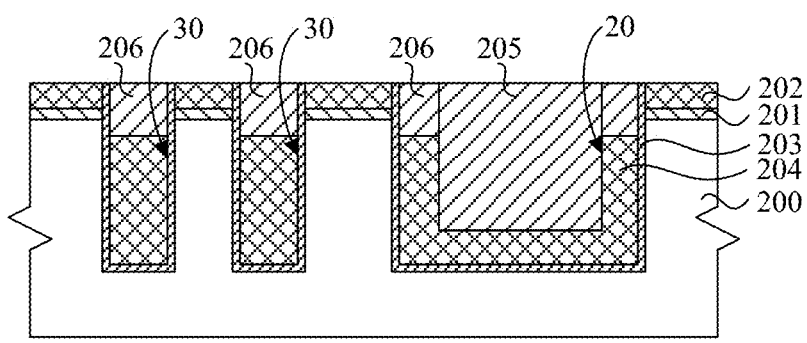

FIG. 3G is a cross-sectional view after a second planarization process has been performed using the method for forming a semiconductor structure according to an embodiment of the present invention. Referring to FIG. 3Q in this embodiment, in step S7, performing a second planarization process till the top surface of the pre-processed substrate is exposed, and wherein the remaining of the second filling dielectric 206 fills up the first trench 20 together with the first filling dielectric 205, with its top surface being flush with that of the pre-processed substrate. In this embodiment, since the surface oxide layer 203 is made of the same material as the second filling dielectric 206, as a result of the second planarization process, the hard mask layer 202 on the top of the pre-processed substrate and serving as a polish stop layer will be exposed.

The second planarization process may also be implemented as a CMP process. Specially, in this CMP process, a greater amount of the filling dielectric is required to be polished away from above the first trench 20 than from the surrounding portions. Therefore, upon the process proceeding to the polish stop layer, there is a greater buffer amount for polishing above the first trench 20. As a result, it is less likely for the portion above the first trench 20 to be concavely dished relative to the surrounding portions after the CMP process. As for the second trench 30, as there is a dense distribution of the hard mask material around, which can slower the polishing process, dishing will barely occur there. Therefore, compared to the conventional method, the CMP process in step S7 according to this embodiment can result in good global flatness of the substrate surface, with reduced risk of dishing. In addition, since the first filling dielectric 205 filling in the first trench 20 has been planarized once prior to the second planarization process, the second planarization process is required to remove not only a thickness of the second filling dielectric 105 above the hard mask layer 202 but also a thickness of the first filling dielectric 205 above the hard mask layer 202. As these thicknesses are rarely affected by the depths of the first and second trenches 20, 30, compared to the approach in which a single dielectric material first fills in the first trench by a single deposition process until its top surface is higher than the substrate surface and then planarized to make its top surface flush with the substrate surface, the total dielectric thickness above the substrate surface can be controlled within a small range. This allows the second planarization process to last for a short time, helping in avoiding adverse effects on the surface flatness of the semiconductor structure arising from a long planarization time.

Further, in the method described above in connection with steps S1-S7, the portion of the filling dielectric above the first trench is made thicker than the remaining thereof prior to the second planarization process, without additional use of any separately fabricated patterned mask, making the method easier to carry out, less costly and suitable to reduce the risk of post-CMP dishing even at smaller process dimensions.

Embodiments of the present invention also relate to a semiconductor structure formed using the method as defined above. Referring to FIG. 3Q the semiconductor structure includes:

a pre-processed substrate with a first trench 20;

an auxiliary layer 204 covering a bottom surface of the first trench 20 and a portion of side surface that is joined to the bottom surface; and a filling dielectric covering the auxiliary layer 204 and filling up the first trench 20.

In the semiconductor structure, a second trench 20 narrower than the first trench 20 may be further formed in the pre-processed substrate. In this case, a lower portion of the second trench 30 may be filled by the auxiliary layer 204, while the remaining portion thereof may be filled by the filling dielectrics located on the second trench 30.

The semiconductor structure may be, for example, an STI or DTI structure formed in a silicon substrate. The pre-processed substrate may include a semiconductor substrate 200 and, formed thereon in advance, a pad oxide layer 201 and a hard mask layer 202. Both the first and second trenches 20, 30 may extend through the hard mask layer 202 and the pad oxide layer 201 and be located at the bottom within the semiconductor substrate 200. A surface oxide layer 203 may cover inner surfaces of the first and second trenches 20, 30 as well as a top surface of the hard mask layer 202. A top surface of the auxiliary layer 204 may be lower than the top surface of the hard mask layer 202 and preferably also lower than a top surface of the semiconductor substrate 200, in order to protect the auxiliary layer 204 from any possible damage during a subsequent process performed on the semiconductor structure for removing the hard mask layer 202. Further, as an insulating dielectric, the auxiliary layer 204 can enhance isolation effect of the STI or DTI structure.

Since this semiconductor structure is formed by the above-described method according to the present invention, good surface flatness is ensured by avoiding the occurrence of dishing above the first trench 20. Therefore, it has a desirable microstructure and, when utilized in the fabrication of a semiconductor component, can enhance the performance of the semiconductor component being fabricated.

While the invention has been described with reference to several preferred embodiments, it is not intended to be limited to these embodiments in any way. Any person of skill in the art may make various possible variations and changes to the disclosed embodiments without departing from the spirit and scope of the invention. Accordingly, any and all such simple variations, equivalents and modifications made to the foregoing embodiments without departing from the scope of the invention are intended to fall within the scope thereof.

What is claimed is:

1. A method for forming a semiconductor structure, comprising:
   providing a pre-processed substrate with a first trench;
   forming an auxiliary layer over the pre-processed substrate, wherein the auxiliary layer covers an inner surface of the first trench and a top surface of the pre-processed substrate;
   forming a first filling dielectric over the pre-processed substrate, wherein the first filling dielectric covers the auxiliary layer and completely fills the first trench;
   performing a first planarization process to remove a portion of the first filling dielectric until the auxiliary layer is exposed, wherein a remaining portion of the first filling dielectric is located in the first trench and surrounded by the auxiliary layer;
   etching back the auxiliary layer so that a top surface of the auxiliary layer is lower than a top surface of the first filling dielectric;
   forming a second filling dielectric over the pre-processed substrate, wherein the second filling dielectric covers the first filling dielectric, the auxiliary layer and the pre-processed substrate, and has a top surface higher than the top surface of the pre-processed substrate; and
   performing a second planarization process until the top surface of the pre-processed substrate is exposed.

2. The method of claim 1, wherein in the step of etching back the auxiliary layer, an etching selectivity ratio of the auxiliary layer to the first filling dielectric is greater than 5.

3. The method of claim 1, wherein each of the first and second planarization processes is implemented as a chemical mechanical polishing process.

4. The method of claim 3, wherein the first trench is formed by:
   sequentially stacking a pad oxide layer and a hard mask layer on a semiconductor substrate, and patterning the hard mask layer;
   forming a first isolation trench by etching the pad oxide layer and the semiconductor substrate with the patterned hard mask layer serving as a mask; and
   forming a surface oxide layer over an inner surface of the first isolation trench and a top surface of the semiconductor substrate.

5. The method of claim 4, wherein after the auxiliary layer is etched back, the top surface of the auxiliary layer is lower than the top surface of the semiconductor substrate.

6. The method of claim 1, wherein the pre-processed substrate is provided with a second trench, wherein the second trench has a width smaller than a width of the first trench, and wherein the second trench is completely filled with the auxiliary layer before the first planarization process is performed.

7. The method of claim 6, wherein after etching back the auxiliary layer, a portion of the auxiliary layer remains in the second trench, and wherein after forming the second filling dielectric, the second filling dielectric covers the portion of the auxiliary layer and fills up the second trench.

8. The method of claim 1, wherein the auxiliary layer comprises silicon nitride, and wherein each of the first and second filling dielectrics comprises silicon oxide.

* * * * *